(12) United States Patent
Lu

(10) Patent No.: US 10,440,163 B2
(45) Date of Patent: Oct. 8, 2019

(54) BRACKET FOR MOUNTING FINGERPRINT IDENTIFICATION ASSEMBLY, COVER PLATE ASSEMBLY AND TERMINAL

(71) Applicant: GUANGDONG OPPO MOBILE TELECOMMUNICATIONS CORP., LTD., Dongguan (CN)

(72) Inventor: Zhongheng Lu, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/855,920

(22) Filed: Dec. 27, 2017

(65) Prior Publication Data

US 2018/0191878 A1 Jul. 5, 2018

(30) Foreign Application Priority Data

Jan. 3, 2017 (CN) .......................... 2017 1 0002484
Oct. 24, 2017 (CN) .......................... 2017 1 1000852

(51) Int. Cl.
  *H04M 1/00* (2006.01)
  *H04M 1/02* (2006.01)
  (Continued)

(52) U.S. Cl.
  CPC .......... *H04M 1/026* (2013.01); *F16B 47/003* (2013.01); *F16M 13/02* (2013.01); *G06F 1/1684* (2013.01); *G06K 9/00919* (2013.01); *H05K 5/0017* (2013.01); *H05K 5/03* (2013.01); *H05K 7/14* (2013.01); *G06K 9/00013* (2013.01)

(58) Field of Classification Search
  CPC .......... H05K 5/0017; H05K 5/03; H05K 7/14; F16B 47/003; F16M 13/02; G06F 1/1684; G06K 9/00013; G06K 9/00919; H04M 1/026
  See application file for complete search history.

(56) References Cited

U.S. PATENT DOCUMENTS 9,001,081 B2 *  4/2015  Pope .................. G06F 3/044
                                                                345/174
9,629,268 B2 *  4/2017  Lee .................... H05K 5/0247
(Continued)

FOREIGN PATENT DOCUMENTS

CN     203965703 U     11/2014
CN     105205474 A     12/2015
(Continued)

OTHER PUBLICATIONS

PCT/CN2017/118485 International Search Report and Written Opinion dated Mar. 28, 2018 10 pages.
(Continued)

*Primary Examiner* — Nhan T Le
(74) *Attorney, Agent, or Firm* — Lathrop Gage LLP

(57) ABSTRACT

The present disclosure relates to a bracket for mounting a fingerprint identification assembly, a cover plate assembly and a terminal. The bracket includes an outer circumferential wall; an inner circumferential wall opposite to the outer circumferential wall; and a bottom wall coupled to the outer circumferential wall. The outer circumferential wall has a corner-removing portion approaching towards the inner circumferential wall.

12 Claims, 6 Drawing Sheets

(51) Int. Cl.
G06F 1/16 (2006.01)
F16B 47/00 (2006.01)
F16M 13/02 (2006.01)
H05K 5/00 (2006.01)
H05K 5/03 (2006.01)
H05K 7/14 (2006.01)
G06K 9/00 (2006.01)

(56) References Cited

U.S. PATENT DOCUMENTS

| | | | |
|---|---|---|---|
| 9,971,923 B2* | 5/2018 | Long | G06K 9/0002 |
| 10,216,976 B2* | 2/2019 | Sun | G01R 31/44 |
| 2013/0176666 A1 | 7/2013 | Yamanaka et al. | |
| 2018/0034948 A1* | 2/2018 | Yu | G06F 1/1684 |

FOREIGN PATENT DOCUMENTS

| | | |
|---|---|---|
| CN | 105635366 A | 6/2016 |
| CN | 105759913 A | 7/2016 |
| CN | 105825165 A | 8/2016 |
| CN | 105825209 A | 8/2016 |
| CN | 105868741 A | 8/2016 |
| CN | 106200810 A | 12/2016 |
| CN | 205788219 U | 12/2016 |
| CN | 106815572 A | 6/2017 |
| CN | 106827547 A | 6/2017 |
| JP | 2011205498 A | 10/2011 |
| WO | WO 2018044425 A1 | 3/2018 |

OTHER PUBLICATIONS

European Patent Application No. 17211050.4 extended Search and Opinion dated May 8, 2018, 10 pages.

Taiwanese Patent Application No. 106144774, Office Action dated Aug. 27, 2018, 4 pages.

* cited by examiner

BRACKET FOR MOUNTING FINGERPRINT IDENTIFICATION ASSEMBLY, COVER PLATE ASSEMBLY AND TERMINAL

CROSS-REFERENCE TO RELATED APPLICATIONS

This application claims priority to and benefits of Chinese Patent Applications No. 201710002484.7, filed with State Intellectual Property Office on Jan. 3, 2017 and Chinese Patent Application No. 201711000852.0, filed with State Intellectual Property Office on Oct. 24, 2017, the entire content of which is incorporated herein by reference.

FIELD

The present disclosure relates to a technical field of communication apparatuses, more particularly to a bracket for mounting a fingerprint identification assembly, a cover plate assembly and a terminal.

BACKGROUND

With rapid developments of the mobile information technology, more and more related activities are carried out in the mobile device. Particularly, with rapid popularization of the mobile device such as the mobile phone and the tablet computer, more and more activities such as payment, identity authentication or the like are carried out in the mobile phone, the tablet computers or the like, and thus it becomes increasingly important to process secure payment and electronic business. Nowadays, various electronic password cards, USB keys or other devices have been widely applied to the computer system. However, in systems of the mobile phone and the table computer, the storage and encryption program of various electronic passwords are still relatively simple, which cannot meet a user's requirement for safety margin. Accordingly, how to achieve a high level of encryption in the mobile phone or other mobile devices will become a hot spot in the next period of time.

In daily life, things that carry out the identity authentication and the security encryption by using the biometric identification become more and more. For example, an access control system based on the fingerprint identification, a security system based on the iris identification, an identity authentication system based on the facial recognition, and so on. For another example, the identity authentication system based on the fingerprint identification is added to the current mobile phone. Specifically, the mobile phone is provided with a fingerprint identification assembly, and in most mobile phones, the fingerprint identification assembly is exposed outside an outer surface of the mobile phone, while occupying a large screen space. Problems relating to the use performance, the water proof performance, and the appearance aesthetics of the fingerprint identification assembly are urgent to be solved.

SUMMARY

According to a first aspect of embodiments of the present disclosure, there is provided a bracket for mounting a fingerprint identification assembly. The bracket according to embodiments of the present disclosure includes: an outer circumferential wall; an inner circumferential wall opposite to the outer circumferential wall; and a bottom wall coupled to the outer circumferential wall. The outer circumferential wall has a corner-removing portion approaching towards the first inner circumferential wall.

According to a second aspect of embodiments of the present disclosure, there is provided a cover plate assembly for a terminal. The cover plate assembly according to embodiments of the present disclosure includes a cover plate and an annular base. The annular base includes an outer circumferential wall and a first inner circumferential wall opposite to the outer circumferential wall. The outer circumferential wall has a corner-removing portion approaching towards the first inner circumferential wall. The cover plate has a mounting hole and a second inner circumferential wall surrounding the mounting hole. The cover plate has a first surface and a second surface opposite to the first surface, and the mounting hole runs through the first surface and the second surface. The annular base is embedded in the mounting hole, and the outer circumferential wall of the annular base is opposite to the second inner circumferential wall of the cover plate. The cover plate assembly has a gap between the corner-removing portion and the second inner circumferential wall.

According to a third aspect of embodiments of the present disclosure, there is provided a terminal. The terminal according to embodiments of the present disclosure includes: a bracket, a fingerprint identification assembly, a cover plate and a display unit. The bracket includes an outer circumferential wall and a first inner circumferential wall opposite to the outer circumferential wall. The outer circumferential wall has a corner-removing portion approaching towards the first inner circumferential wall. The fingerprint identification assembly is received in the bracket. The cover plate has a mounting hole and a second inner circumferential wall surrounding the mounting hole. The mounting hole runs through the cover plate in a thickness direction of the cover plate. The display unit is embedded in the cover plate. The bracket is embedded in the mounting hole, and the outer circumferential wall of the bracket is opposite to the second inner circumferential wall of the cover plate, and the terminal has a gap between the corner-removing portion and the second inner circumferential wall.

DETAILED DESCRIPTION

Figure 1:
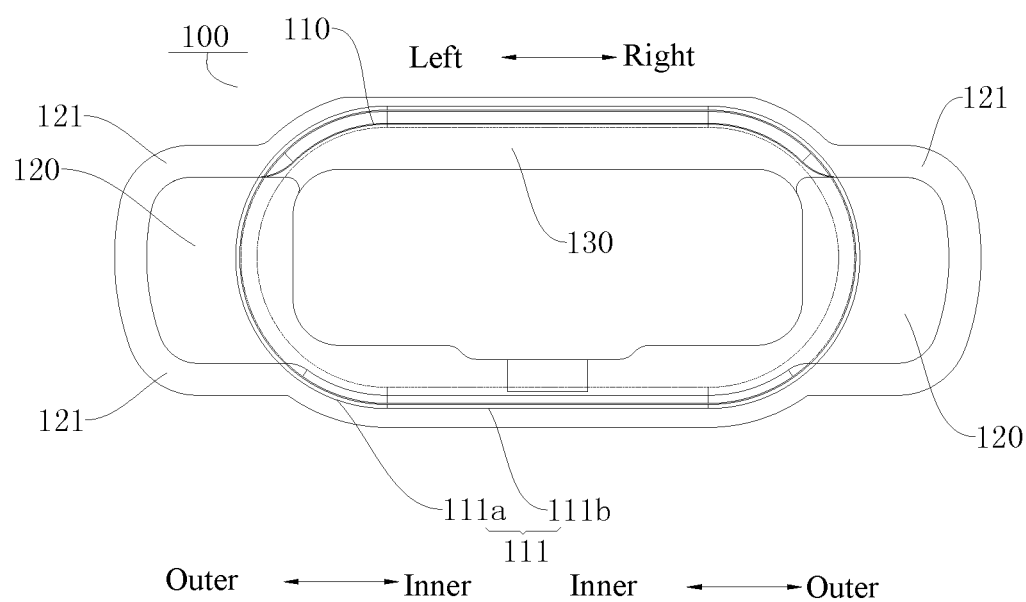
FIG. 1 illustrates a schematic view of a bracket for a fingerprint identification assembly according to an embodiment of the present disclosure.

Embodiments of the present disclosure will be described in detail below, and examples of the embodiments are illustrated in accompanying drawings. The embodiments described herein with reference to drawings are explanatory, illustrative, and used to generally understand the present disclosure. The embodiments shall not be construed to limit the present disclosure.

In the specification, unless specified or limited otherwise, relative terms such as "central", "longitudinal", "lateral", "length", "width", "thickness", "front", "rear", "right", "left", "lower", "upper", "horizontal", "vertical", "up", "top", "bottom", "inner", "outer", "axial", "radial", "circumferential" as well as derivative thereof (e.g., "horizontally", "downwardly", "upwardly", etc.) should be construed to refer to the orientation as then described or as illustrated in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance. Thus, the feature defined with "first" and "second" can comprise one or more of this feature. In the description of the present disclosure, "a plurality of" means two or more than two, unless specified otherwise.

In the present disclosure, unless specified or limited otherwise, the terms "mounted", "connected", "coupled", "fixed" and the like are used broadly, and can be, for example, fixed connections, detachable connections, or integral connections; can also be mechanical or electrical connections; can also be direct connections or indirect connections via intervening structures; can also be inner communications of two elements. The above terms can be understood by those skilled in the art according to specific situations.

As illustrated in FIGS. 1 to 5, embodiments of the present disclosure provide a bracket 100 for mounting a fingerprint identification assembly. The bracket 100 includes an outer circumferential wall 112, an inner circumferential wall opposite to the outer circumferential wall 112, and a bottom wall 113 coupled to the outer circumferential wall 112. The outer circumferential wall 112 has a corner-removing portion 122 approaching towards the inner circumferential wall, i.e. a part of the outer circumferential wall 112 is inclined towards the inner circumferential wall to form the corner-removing portion 122. The outer circumferential wall 112 includes a first wall surface 1121 and a second wall surface 1122 obliquely extending from the first wall surface 1121. The second wall surface 1122 is coupled to the bottom wall 113. The second wall surface 1122 gradually approaches the inner circumferential wall in its extending direction from the first wall surface 1121 to the bottom wall 113. The corner-removing portion 122 is constituted by the first wall surface 1121 and the second wall surface 1122.

It should be noted that the bracket 100 can be configured as an annular base 110, and a first inner circumferential wall 114 of the annular base 110 can be configured as the inner circumferential wall of the bracket 100. A cover plate 210 has a mounting hole 213 therein, and also has a first surface 211 and a second surface 212 opposite to the first surface 211. The mounting hole 213 runs through the first surface 211 and the second surface 212. It should be noted that the first surface 211 can be configured as an upper surface of a screen of the terminal 300, and the second surface 212 can be configured as a lower surface of the screen of the terminal 300. The annular base 110 is embedded in the mounting hole 213.

When the bracket 100 is assembled to a cover plate 210, for example being embedded in a mounting hole 213 of the cover plate 210, the outer circumferential wall 112 of the bracket 100 is opposite to a second inner circumferential wall 214 surrounding the mounting hole 213 of the cover plate 210. A gap 10 is defined between the outer circumferential wall 112 of the bracket 100 and the second inner circumferential wall 214. In other words, the gap 10 is defined between the corner-removing portion 122 and the second inner circumferential wall 214. The gap 10 includes a first gap 101 between the first wall surface 1121 and the second inner circumferential wall 214 and a second gap 102 between the second wall surface 1122 and the second inner circumferential wall 214. A width of the second gap 102 between the second wall surface 1122 and the second inner circumferential wall 214 is greater than a width of the first gap 101 between the first wall surface 1121 and the second inner circumferential wall 214. The width of the second gap 102 between the second wall surface 1122 and the second inner circumferential wall 214 gradually increases in the extending direction of the second wall surface 1122 from the first wall surface 1121 to the bottom wall 113.

With the bracket 100 according to embodiments of the present disclosure, when the bracket 100 is assembled to the cover plate 210, by providing the corner-removing portion 122 to the outer circumferential wall 112, more glue can be filled into the gap 10 between the corner-removing portion 122 and the second inner circumferential wall 214, such that more glue can be contained, and thus the bracket 100 can be assembled to the cover plate 210 more stably and firmly.

Figure 2:
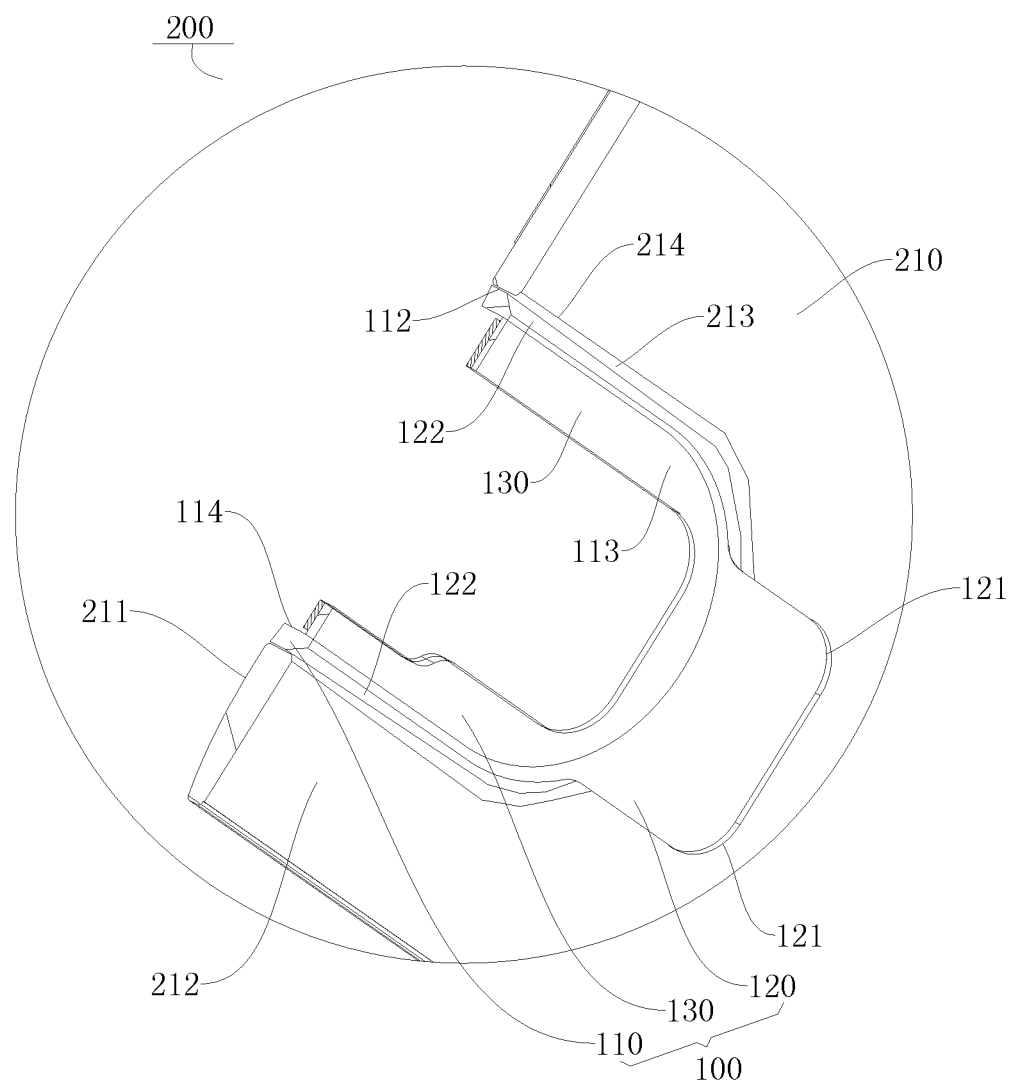
FIG. 2 illustrates a schematic view of a cover plate assembly for a terminal according to an embodiment of the present disclosure.
Figure 3:
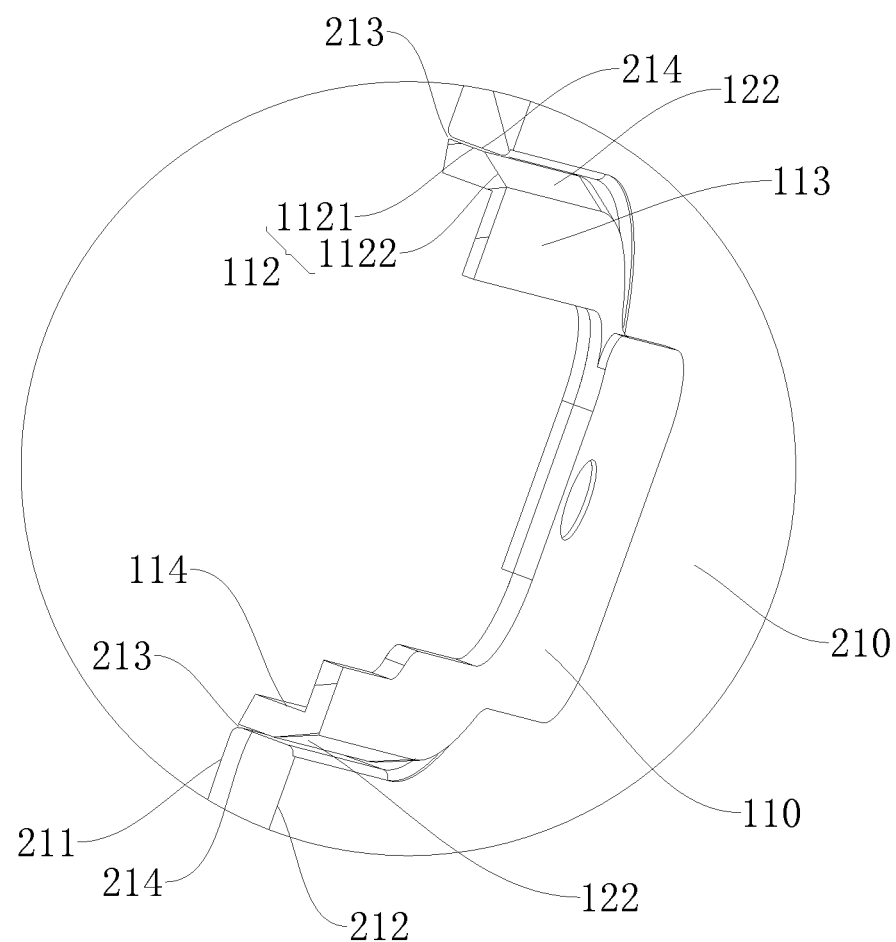
FIG. 3 illustrates a schematic view of a cover plate assembly for a terminal according to an embodiment of the present disclosure.
Figure 4:
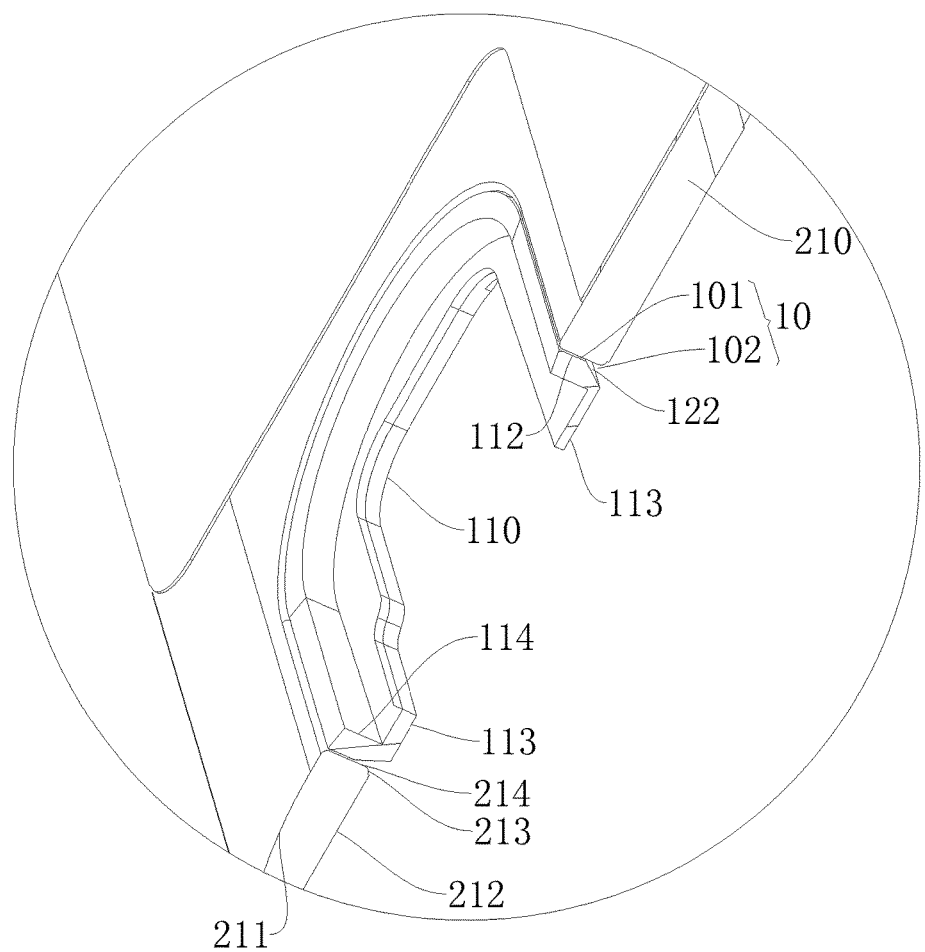
FIG. 4 illustrates a schematic view of a cover plate assembly for a terminal according to an embodiment of the present disclosure.
Figure 5:
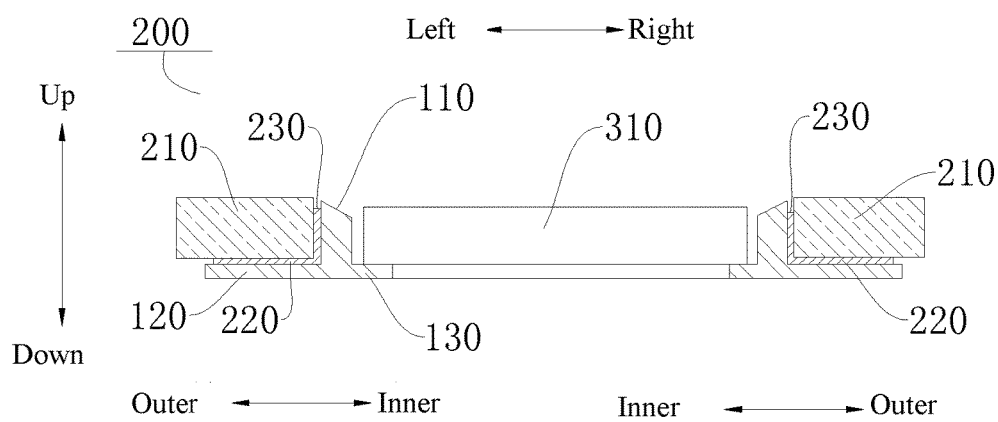
FIG. 5 illustrates a sectional view of a cover plate assembly for a terminal according to an embodiment of the present disclosure.
Figure 6:
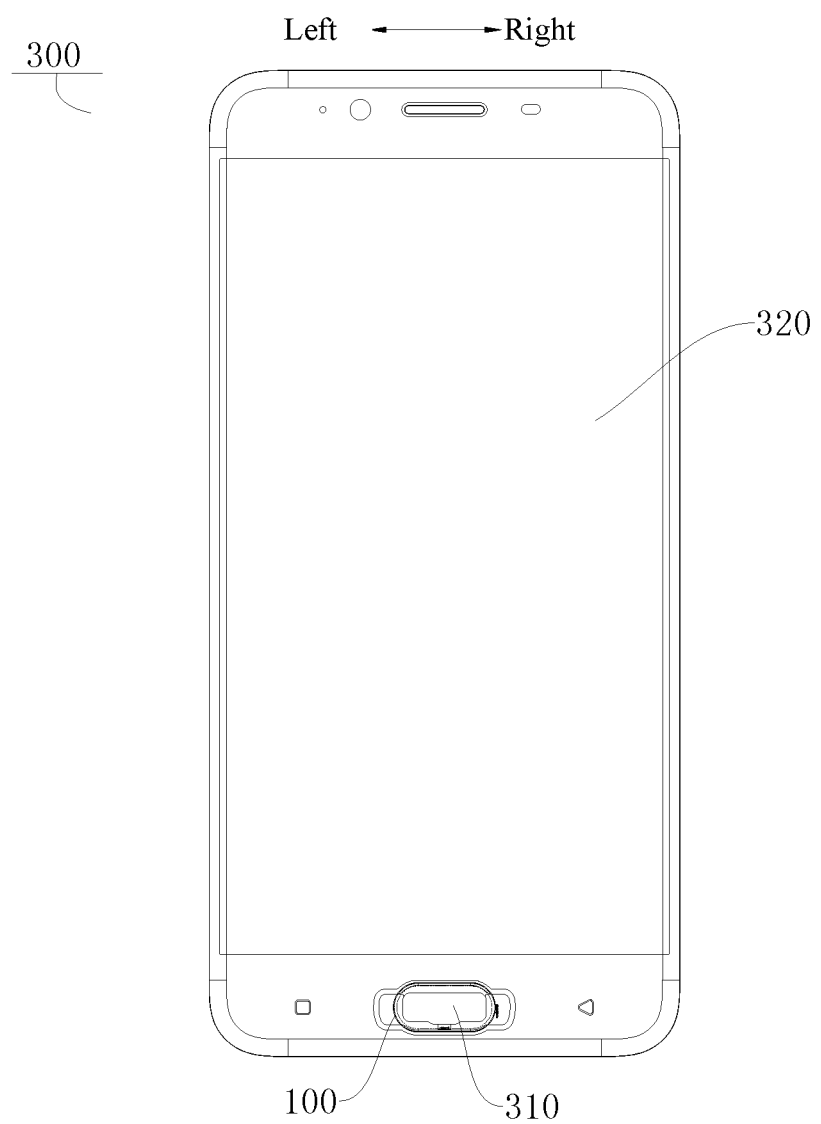
FIG. 6 illustrates a schematic view of a terminal according to an embodiment of the present disclosure.

As illustrated in FIG. 2, the bracket 100 according to embodiments of the present disclosure includes an annular base 110, and a fingerprint identification assembly 310 can be embedded in the annular base 110.

The annular base 110 has an outer wall configured as the outer circumferential wall 112 of the bracket 100 and an inner wall (i.e. the first inner circumferential wall 114) configured as the inner circumferential wall of the bracket. In other words, the annular base 110 includes the outer circumferential wall 112, the first inner circumferential wall 114 opposite to the outer circumferential wall 112, and the bottom wall 113 coupled to the outer circumferential wall 112. The outer circumferential wall 112 defines the corner-removing portion 122 approaching towards the first inner circumferential wall 114. The outer circumferential wall 112 includes the first wall surface 1121 and the second wall surface 1122 obliquely extending from the first wall surface 1121. The second wall surface 1122 is coupled to the bottom wall 113. The second wall surface 1122 gradually approaches the first inner circumferential wall 114 in its extending direction from the first wall surface 1121 to the bottom wall 113. The corner-removing portion 122 is constituted by the first wall surface 1121 and the second wall surface 1122.

It should be noted that the bracket 100 can be configured as the annular base 110, and the first inner circumferential wall 114 of the annular base 110 can be configured as the inner circumferential wall of the bracket 100. The cover plate 210 has the mounting hole 213 therein, and also has the first surface 211 and the second surface 212 opposite to the first surface 211. The mounting hole 213 runs through the first surface 211 and the second surface 212. It should be noted that the first surface 211 can be configured as the upper surface of the screen of the terminal 300, and the second surface 212 can be configured as the lower surface of the screen of the terminal 300. The annular base 110 is embedded in the mounting hole 213.

When the annular base 110 is mounted to the cover plate 210, the outer circumferential wall 112 of the annular base 110 is opposite to the second inner circumferential wall 214 surrounding the mounting hole 213 of the cover plate 210. The gap 10 is defined between the outer circumferential wall 112 of the annular base 110 and the second inner circumferential wall 214. In other words, the gap 10 is defined between the corner-removing portion 122 and the second inner circumferential wall 214. The gap 10 includes the first gap 101 between the first wall surface 1121 and the second inner circumferential wall 214 and the second gap 102 between the second wall surface 1122 and the second inner circumferential wall 214. The width of the second gap 102 between the second wall surface 1122 and the second inner circumferential wall 214 is greater than the width of the first gap 101 between the first wall surface 1121 and the second inner circumferential wall 214. The width of the second gap 102 between the second wall surface 1122 and the second inner circumferential wall 214 gradually increases in the extending direction of the second wall surface 1122 from the first wall surface 1121 to the bottom wall 113.

It should be noted that the annular base 110 can be embedded in the cover plate 210 of the terminal 300, by providing the corner-removing portion 122 to the outer circumferential wall 112 of the annular base 110, the gap between the corner-removing portion 122 and the cover plate 210 can be increased, that is, the gap between the annular base 110 and the cover plate 210 can be increased, so that when an infilling such as a glue or the like is filled into the gap, on one hand, the glue can flow into the gap smoothly to increase the adhesive bonding area, and on the other hand, a serrated structure of the infilling can be eliminated to improve an appearance shape of the terminal 300, thereby improving the appearance expressive force and the structural stability of the terminal 300.

Moreover, when a user presses the fingerprint identification assembly 310 received in the bracket 100 during a usage of the terminal 300, a pushing force can be fed back to the user due to the infilling (such as the glue or the like) filled in the gap, thus improving the user experience.

As illustrated in FIG. 1, the bracket 100 for mounting the fingerprint identification assembly 310 according to embodiments of the present disclosure includes the annular base 110 and a plurality of coupling lugs 120 spaced apart from one another.

In some embodiments of the present disclosure, as illustrated in FIGS. 1 to 5, the fingerprint identification assembly 310 is embedded in the annular base 110, and each coupling lug 120 extends from an end of the annular base 110 and protrudes outwards in a radial direction of the annular base 110, and another corner-removing portion 121 is provided between an end surface of a free end of the coupling lug 120 and a side wall of the coupling lug 120. In some embodiments of the present disclosure, the corner-removing portion 121 and/or the corner-removing portion 122 can be a fillet, a chamfer or a combination thereof.

According to an embodiment of the present disclosure, the corner-removing portion 122 can be configured as the fillet, and a radius of the corner-removing portion 122 is greater than or equal to 0.1 mm. After experimental validation, when the radius of the corner-removing portion 122 is greater than or equal to 0.1 mm, the connection between the bracket 100 and the cover plate 210 is more stable, and the appearance of the terminal 300 is more artistic.

According to an embodiment of the present disclosure, as illustrated in FIG. 1, the outer circumferential wall 112 of the annular base 110 includes a plurality of structural surfaces 111, two adjacent structural surfaces 111 are in smooth transition with each other, and the plurality of structural surfaces 111 includes an arc-shaped surface 111a or a flat surface 111b, i.e. each structural surface 111 can be configured as the arc-shaped surface 111a or the flat surface 111b. Thus, a line smoothness of the bracket 100 can be promoted, such that the appearance expressive force of the bracket 100 can be improved, and also the connection between the bracket 100 and the cover plate 210 can be facilitated, thereby improving the stability and reliability of the connection between the bracket 100 and the cover plate 210. Additionally, by providing the plurality of structural surfaces 111 in smooth transition with one another, when the infilling such as the glue or the like is filled into a gap between the annular base 110 and the cover plate 210, the glue can flow into the gap smoothly. Thus, the adhesive bonding area can be increased, and also the serrated structure of the infilling can be eliminated to improve the appearance shape of the terminal 300, thereby improving the appearance expressive force of the terminal 300.

Moreover, when a user presses the fingerprint identification assembly 310 received in the bracket 100 during a usage of the terminal 300, a pushing force can be fed back to the user due to the infilling (such as the glue or the like) filled in the gap, thus improving the user experience.

Further, as illustrated in FIG. 1, the plurality of structural surfaces 111 is arranged in a circumferential direction of the annular base 110. Thus, the appearance expressive force of the bracket 100 can be further improved, and the stability and reliability of the connection between the bracket 100 and the cover plate 210 can be further enhanced. In the embodiment as illustrated in FIG. 1, the outer circumferential wall of the annular base 110 is constructed by the plurality of structural surfaces 111 sequentially connected in smooth transition. The plurality of structural surfaces 111 includes at least one flat surface 111b and at least one arc-shaped surface 111a. That is, the plurality of structural surfaces 111 is sequentially arranged to the outer circumferential wall of the annular base 110 in the circumferential direction of the annular base 110, and two adjacent structural surfaces 111 are in smooth transition with each other. Thus, the gap between the annular base 110 and the cover plate 210 can be enlarged, so that when the infilling such as the glue or the like is filled into the gap, a surface at the smooth transition and the arc-shaped surface 111a can enable the glue to flow into the gap smoothly. Thus, the adhesive bonding area can be increased, and also the serrated structure of the infilling can be eliminated to improve the appearance shape of the terminal 300, thereby improving the appearance expressive force of the terminal 300.

Moreover, when a user presses the fingerprint identification assembly 310 received in the bracket 100 during a usage of the terminal 300, a pushing force can be fed back to the user due to the infilling (such as the glue or the like) filled in the gap, thus improving the user experience.

As illustrated in FIGS. 1 to 5, according to an embodiment of the present disclosure, the annular base 110 is provided with a support part 130, and the support part 130 extends from the annular base 110 and protrudes inwards in the radial direction of the annular base 110. In some embodiments of the present disclosure, the support part 130 can be configured to support the fingerprint identification assembly 310, such that the fingerprint identification assembly 310 can be mounted in the annular base 110 conveniently. In this case, a bottom wall of the support part 130 can be configured as the bottom wall 113 of the annular base 110.

Further, in the embodiment as illustrated in FIG. 1, one support part 130 can be provided and the one support part 130 is annular. Thus, on one hand, the support part 130 can be manufactured in the annular base 110 conveniently; on the other hand, an assembling stability of the fingerprint identification assembly 310 can be enhanced. In embodiments of the present disclosure, a shape of the support part 130 is not limited to this, as long as the shape of the support part 130 facilitates manufacturing thereof and assembling of the fingerprint identification assembly 310. For example, in another embodiment of the present disclosure, a plurality of support parts 130 can be provided, and the plurality of support parts 130 is arranged in the circumferential direction of the annular base 110 and spaced apart from one another.

According to an embodiment of the present disclosure, two coupling lugs 120 are provided and located at two opposite ends of the annular base 110. Thus, on one hand, a structure of the bracket 100 can be simplified to save a production cost; on the other hand, the stability and reliability of the connection between the bracket 100 and the cover plate 210 can be improved. As illustrated in FIG. 1, the two coupling lugs 120 are located at left and right ends of the annular base 110 respectively.

As illustrated in FIGS. 1 to 6, the cover plate assembly 200 for the terminal 300 according to embodiments of the present disclosure includes the cover plate 210 and the above bracket 100, in which the annular base 110 of the bracket 100 is embedded in the cover plate 210, and a gap is provided between the cover plate 210 and the corner-removing portion 122.

In embodiments of the present disclosure, the cover plate 210 has a mounting hole 213 therein, and also has a first surface 211 and a second surface 212 opposite to the first surface 211. The mounting hole 213 runs through the first surface 211 and the second surface 212. It should be noted that the first surface 211 can be configured as an upper surface of a screen of the terminal 300, and the second surface 212 can be configured as a lower surface of the screen of the terminal 300. The annular base 110 is embedded in the mounting hole 213.

In the cover plate assembly 200 for the terminal 300 according to embodiments of the present disclosure, by providing the corner-removing portion 122 to the outer circumferential wall 112 of the annular base 110, the gap between the annular base 110 and the cover plate 210 can be increased. When the infilling such as the glue or the like is filled into the gap, on one hand, the glue can flow into the gap smoothly so as to increase the adhesive bonding area, and on the other hand, the serrated structure of the infilling can be eliminated to improve the appearance shape of the terminal 300, thereby improving the appearance expressive force and the structural stability of the terminal 300.

Moreover, when a user presses the fingerprint identification assembly 310 received in the bracket 100 during a usage of the terminal 300, a pushing force can be fed back to the user due to the infilling (such as the glue or the like) filled in the gap, thus improving the user experience.

As illustrated in FIGS. 1 to 6, the cover plate assembly 200 for the terminal 300 according to embodiments of the present disclosure includes the cover plate 210 and the above bracket 100.

In some embodiments of the present disclosure, the annular base 110 of the bracket 100 is embedded in the cover plate 210, and the coupling lug 120 of the bracket 100 is adhered to a lower surface of the cover plate 210, in which a first adhesive layer 220 is provided between the coupling lug 120 and the cover plate 210, and a second adhesive layer 230 is provided between the outer circumferential wall 112 of the annular base 110 and the cover plate 210. In some embodiments of the present disclosure, the first adhesive layer 220 and the second adhesive layer 230 can be formed by means of a glue or a double sided adhesive tape, thus simplifying the assembling process and saving the production cost. In some embodiments of the present disclosure, when the first adhesive layer 220 and the second adhesive layer 230 are to be filled between the bracket 100 and the cover plate 210, the first adhesive layer 220 and the second adhesive layer 230 can be manufactured and formed by means of an adhesive dispensing process at a periphery of the annular base 110 and in an ultraviolet (UV) curing or thermal curing manner. Additionally, when the infilling such as the glue or the like is filled into the gaps between the bracket 100 and the cover plate 210, the adhesive bonding area can be increased, and also the serrated structure of the infilling can be eliminated to improve the appearance shape of the terminal 300, thereby improving the appearance expressive force of the terminal 300.

Moreover, when a user presses the fingerprint identification assembly 310 received in the bracket 100 during a usage of the terminal 300, a pushing force can be fed back to the user due to the infilling (such as the glue or the like) filled in the gaps, thus improving the user experience.

Herein, colors of the first adhesive layer 220 and the second adhesive layer 230 are not specifically limited, and the colors of the first adhesive layer 220 and the second adhesive layer 230 can be selected according to a color of an outer surface of the cover plate 210. For example, a white adhesive can be dispensed for a white-ink glass cover plate, and a black adhesive can be dispensed for a black-ink glass cover plate.

According to an embodiment of the present disclosure, at least one of the first adhesive layer 220 and the second adhesive layer 230 is a UV curing adhesive layer or a thermal curing adhesive layer. Thus, a manufacturing process of the first adhesive layer 220 and the second adhesive layer 230 can be simplified to reduce the production cost.

Figure 7:
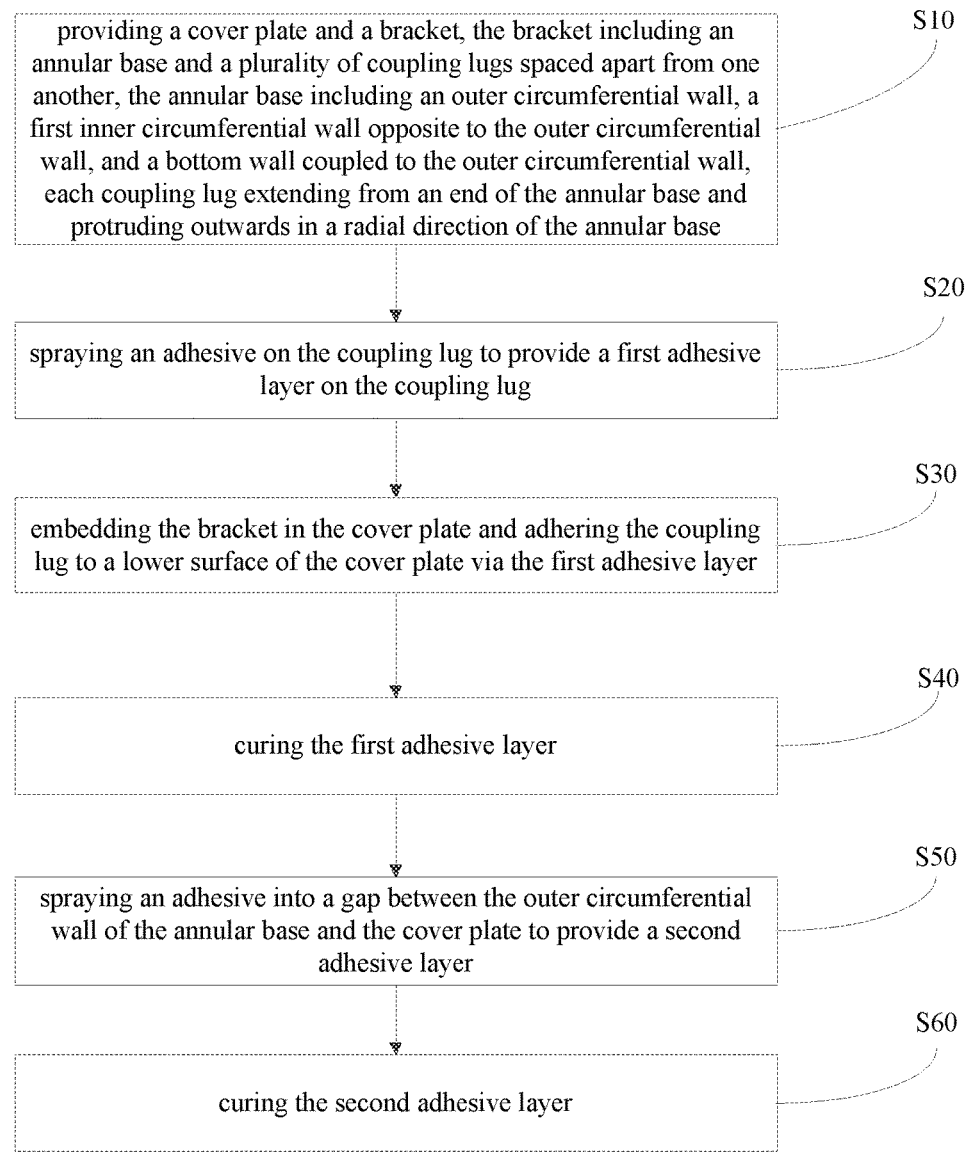
FIG. 7 illustrates a flow chart of a method for manufacturing a cover plate assembly according to an embodiment of the present disclosure.

As illustrated in FIG. 7 in combination with FIGS. 1 to 6, a manufacturing method for a cover plate assembly for a terminal according to embodiments of the present disclosure includes actions at the following blocks.

At block S10: a cover plate 210 and a bracket 100 are provided. The bracket 100 includes an annular base 110 and a plurality of coupling lugs 120 spaced apart from one another. The annular base 110 includes an outer circumferential wall 112, a first inner circumferential wall 114 opposite to the outer circumferential wall 112, and a bottom wall 113 coupled to the outer circumferential wall 112. The outer circumferential wall 112 defines a corner-removing portion 122 approaching towards the first inner circumferential wall 114. Each coupling lug 120 extends from an end of the annular base 110 and protrudes outwards in a radial direction of the annular base 110. Each coupling lug 120 has another corner-removing portion 121 between an end surface of a free end of the coupling lug 120 and a side wall of the coupling lug 120.

In embodiments of the present disclosure, the outer circumferential wall 112 includes the first wall surface 1121 and the second wall surface 1122 obliquely extending from the first wall surface 1121. The second wall surface 1122 is coupled to the bottom wall 113. The second wall surface 1122 gradually approaches the first inner circumferential wall 114 in its extending direction from the first wall surface 1121 to the bottom wall 113. The corner-removing portion 122 is constituted by the first wall surface 1121 and the second wall surface 1122.

At block S20: an adhesive is sprayed on the coupling lug 120 to provide a first adhesive layer 220 on the coupling lug 120.

At block S30: the bracket 100 is embedded in the cover plate 210 and the coupling lug 120 is adhered to a lower surface of the cover plate 210 via the first adhesive layer 220.

At block S40: the first adhesive layer 220 is cured.

At block S50: an adhesive is sprayed into a gap between the outer circumferential wall of the annular base 110 and the cover plate 210 to provide a second adhesive layer 230.

At block S60: the second adhesive layer 230 is cured.

In the manufacturing method for the cover plate assembly for the terminal according to embodiments of the present disclosure, by providing the first adhesive layer and the second adhesive layer, the bracket and the cover plate can be connected together securely; additionally, by providing the corner-removing portion to the outer circumferential wall of the annular base, the gap between the annular base and the cover plate can be increased, such that when the infilling such as the glue or the like is filled into the gap, the corner-removing portion can enable the glue to flow into the gap smoothly. Thus, the adhesive bonding area can be increased, and also the serrated structure of the infilling can be eliminated to improve the appearance shape of the terminal, thereby improving the appearance expressive force and the structural stability of the terminal. Moreover, when a user presses the fingerprint identification assembly received in the bracket during a usage of the terminal, a pushing force can be fed back to the user due to the infilling (such as the glue or the like) filled in the gap, thus improving the user experience.

According to an embodiment of the present disclosure, at block S20, the first adhesive layer 220 includes a thermal curing epoxy adhesive or a UV curing adhesive. When the first adhesive layer 220 includes the thermal curing epoxy adhesive, the first adhesive layer 220 undergoes a thermal curing at block S40. When the first adhesive layer 220 includes the UV curing adhesive, the first adhesive layer 220 undergoes an exposure to UV lights at block S40. Thus, the assembling process can be simplified and the production cost can be saved.

According to an embodiment of the present disclosure, before the first adhesive layer 220 is cured, the cover plate 210 and the bracket 100 are turned over, so that the lower surface of the cover plate 210 faces upwards. Thus, the cover plate 210 and the bracket 100 can be connected together securely and stably.

According to an embodiment of the present disclosure, at block S50, the second adhesive layer 230 includes a thermal curing epoxy adhesive or a UV curing adhesive. When the second adhesive layer 230 includes the thermal curing epoxy adhesive, the second adhesive layer 230 undergoes a thermal curing at block S60. When the second adhesive layer 230 includes the UV curing adhesive, the second adhesive layer 230 undergoes an exposure to UV lights at block S60. Thus, the assembling process can be simplified and the production cost can be saved.

According to an embodiment of the present disclosure, at block S20, the first adhesive layer 220 is formed by adhesive dispensing or silk-screen printing. Thus, the assembling process can be simplified and the production cost can be saved. According to another embodiment of the present disclosure, at block S50, the second adhesive layer 230 is formed by adhesive dispensing or silk-screen printing.

In order to further simplify the assembling procedure of the cover plate assembly 200, according to an embodiment of the present disclosure, at block S20 or block S50, a shape of the bracket 100 is captured by a charge-coupled device (CCD) to determine a path of the first adhesive layer 220 or the second adhesive layer 230 before spraying the adhesive.

Figure 8:
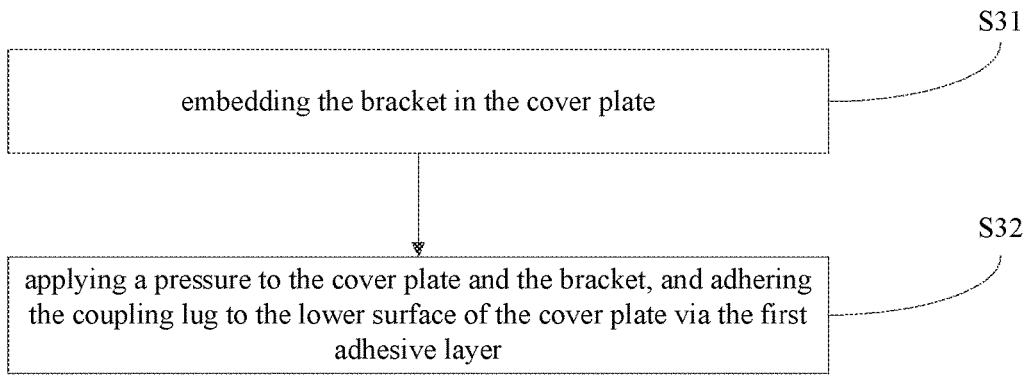
FIG. 8 illustrates a flow chart of an action of the method in FIG. 7.

According to an embodiment of the present disclosure, as illustrated in FIG. 8, the action at block S30 can include actions at the following blocks.

At block S31: the bracket 100 is embedded in the cover plate 210.

At block S32: a pressure is applied to the cover plate 210 and the bracket 100, and the coupling lug is adhered to the lower surface of the cover plate 210 via the first adhesive layer 220.

Thus, the cover plate 210 and the bracket 100 can be connected together securely and stably.

The terminal 300 according to embodiments of the present disclosure includes the above cover plate assembly 200 for the terminal 300.

In the terminal 300 according to embodiments of the present disclosure, by providing the corner-removing portion 122 to the outer circumferential wall of the annular base 110, the gap between the annular base 110 and the cover plate 210 can be increased, such that when the infilling such as the glue or the like is filled into the gap, the corner-removing portion 122 can enable the glue to flow into the gap smoothly. Thus, the adhesive bonding area can be increased, and also the serrated structure of the infilling can be eliminated to improve the appearance shape of the terminal 300, thereby improving the appearance expressive force and the structural stability of the terminal 300. Moreover, when a user presses the fingerprint identification assembly 310 received in the bracket 100 during a usage of the terminal 300, a pushing force can be fed back to the user due to the infilling (such as the glue or the like) filled in the gap, thus improving the user experience.

In some embodiments of the present disclosure, the "terminal" (or called as "communication terminal" or "mobile terminal") used herein includes, but is not limited to a device configured to receive/send a communication signal through a wired connection (for example, through a Public Switched Telephone Network (PSTN), a digital subscriber line (DSL), a digital cable, a direct cable connection, and/or another data connection/network) and/or through a wireless interface (for example, with respect to a cellular network, a Wireless Local Area Network (WLAN), a digital television network such as DVB-H network, a satellite network, AM-FM broadcast transmitter and/or another communication terminal). The communication terminal which is configured to communicate through the wireless interface can be called as a "wireless communication terminal", a "wireless terminal" and/or a "mobile terminal". The example of the mobile terminal includes, but is not limited to a satellite or cellular phone; a personal communication system (PCS) terminal which can combine a cellular radiotelephone with data processing, facsimile and data communication capacity; a PDA which can include a radiotelephone, a pager, an internet/intranet access, a Web browser, a blotter, a calendar and/or a global positioning system (GPS); and a regular laptop and/or a handheld receiver or other electric devices including a radiotelephone transceiver.

The terminal 300 applicable in the present disclosure is explained by taking a mobile phone as an example. In an embodiment of the present disclosure, the mobile phone can include a radio frequency circuit, a memory, an input unit, a wireless fidelity (WiFi) module, a display unit 320, a sensor, an audio circuit, a processor, a projecting unit, a camera unit, a battery or other components.

The radio frequency circuit can be configured to receive and send signals during an information receiving and sending process or a call. Particularly, the radio frequency circuit receives downlink information from a base station, then delivers the downlink information to the processor for processing, and sends uplink data of the mobile phone to the base station. Generally, the radio frequency circuit includes, but is not limited to, an antenna, at least one amplifier, a transceiver, a coupler, a low noise amplifier (LNA), and a duplexer. In addition, the radio frequency circuit can also communicate with a network and another device by wireless communication. The wireless communication can use any communication standard or protocol, which includes, but is not limited to, Global System for Mobile communications (GSM), General Packet Radio Service (GPRS), Code Division Multiple Access (CDMA), Wideband Code Division Multiple Access (WCDMA), Long Term Evolution (LTE), e-mail, Short Messaging Service (SMS), and the like.

The memory can be configured to store a software program and modules. The processor runs the software program and modules stored in the memory, to implement various functional applications and data processing of the mobile phone. The memory can mainly include a program storage area and a data storage area. The program storage area can store an operating system, an application program required by at least one function (such as a sound playback function and an image display function), and the like. The data storage area can store data (such as audio data and an address book, etc.) created according to use of the mobile phone, and the like. In addition, the memory can include a high speed random access memory, and can also include a non-volatile memory such as at least one magnetic disk storage device, a flash memory, or another volatile solid-state storage device.

The input unit can be configured to receive input digit or character information, and generate a keyboard signal related to the user setting and function control of the mobile phone. In some embodiments of the present disclosure, the input unit can include a touch panel and other input devices. The touch panel, which can also be referred to as a touch screen, can collect a touch operation made by a user on or near the touch panel (such as an operation made by a user on or near the touch panel by using any suitable object or accessory, such as a finger or a stylus), and drive a corresponding connection apparatus according to a preset program. Optionally, the touch panel can include two parts: a touch detection apparatus and a touch controller. The touch detection apparatus detects a touch position of the user, detects a signal generated by the touch operation, and transfers the signal to the touch controller. The touch controller receives the touch information from the touch detection apparatus, converts the touch information into touch point coordinates, and sends the touch point coordinates to the processor. Moreover, the touch controller can receive and execute a command sent from the processor. In addition, the touch panel can be a resistive, capacitive, infrared, or surface sound wave type touch panel. In addition to the touch panel, the input unit can further include the input device. In some embodiments of the present disclosure, the input device can include, but is not limited to, one or more of a physical keyboard, a functional key (such as a volume control key or a switch key), a track ball, a mouse, and a joystick.

The display unit 320 can be embedded in the cover plate assembly 200 and configured to display information input by the user or information provided for the user, and various menus of the mobile phone. The display unit can include a display panel. Optionally, the display panel can be configured by using a liquid crystal display (LCD), an organic light-emitting diode (OLED), or the like. Further, the touch panel can cover the display panel. After detecting a touch operation on or near the touch panel, the touch panel transfers the touch operation to the processor, so as to determine the type of the touch event. Then, the processor provides a corresponding visual output on the display panel according to the type of the touch event.

The region in the display panel displaying the visual output which can be identified by human eyes can be used as the after-mentioned "display area". The touch panel and the display panel can be used as two separated parts to realize the input and output function of the mobile phone, or can be integrated to realize the input and output function of the mobile phone.

In addition, the mobile phone can further include at least one sensor, such as an attitude sensor, an optical sensor, and a fingerprint identification assembly 310.

In some embodiments of the present disclosure, the attitude sensor can also be referred to as the motion sensor. As one type of motion sensor, a gravity sensor can be enumerated. The gravity sensor can be made into a cantilever type shifter using an elastic sensitive element, and drive an electric contact using an energy storage spring made of an elastic sensitive element, such that the gravity change can be converted into the change of an electric signal.

As another type of motion sensor, an acceleration sensor can be enumerated. The acceleration sensor can detect magnitude of accelerations in various directions (generally on three axes), can detect magnitude and a direction of the gravity when static, and can be applied to an application that recognizes the attitude of the mobile phone (for example, switching between landscape orientation and portrait orientation, a related game, and magnetometer attitude calibration), a function related to vibration recognition (such as a pedometer and a knock), and the like.

In an embodiment of the present disclosure, the above mentioned motion sensor can be used as an element for acquiring the after-mentioned "attitude parameters", but the present disclosure is not limited thereto. Other sensors able to acquire "attitude parameters" shall fall within the scope of the present disclosure, such as a gyroscope. The working principle and data processing of the gyroscope can be similar to those in the related art, and the detailed explanations are omitted for simplicity.

The fingerprint identification assembly 310 can be disposed on the cover plate assembly 200 and a fingerprint input area of the fingerprint identification assembly 310 can be located in the display unit 320 or disposed at a position close to the display unit 320.

In addition, in an embodiment of the present disclosure, other sensors, such as a barometer, a hygrometer, a thermometer, and an infrared sensor can be configured as the sensor, which are not further described herein.

The optical sensor can include an ambient light sensor and a proximity sensor. The ambient light sensor can adjust luminance of the display panel according to brightness of the ambient light. The proximity sensor can switch off the display panel and/or backlight when the mobile phone is moved to the ear.

The audio circuit, a loudspeaker, and a microphone can provide audio interfaces between the user and the mobile phone. The audio circuit can convert received audio data into an electric signal and transmit the electric signal to the loudspeaker. The loudspeaker converts the electric signal into a sound signal for output. On the other hand, the microphone converts a collected sound signal into an electric signal. The audio circuit receives the electric signal and converts the electric signal into audio data, and outputs the audio data to the processor for processing. Then, the processor sends the audio data to, for example, another terminal device by using the radio frequency circuit, or outputs the audio data to the memory for further processing.

WiFi is a short distance wireless transmission technology. The mobile phone can help, by using the WiFi module, the user to receive and send e-mails, browse a webpage, access streaming media, and so on, which provides wireless broadband Internet access for the user.

The processor is the control center of the mobile phone, and is coupled with various parts of the mobile phone by using various interfaces and lines. By running or executing the software program and/or modules stored in the memory, and invoking data stored in the memory, the processor performs various functions and data processing of the mobile phone, thereby performing overall monitoring on the mobile phone. Optionally, the processor can include one or more processing cores. In some embodiments of the present disclosure, the processor can integrate an application processor and a modem. The application processor mainly processes an operating system, a user interface, an application program, and the like. The modem mainly processes wireless communication.

It can be understood that the foregoing modem can also not be integrated into the processor.

Moreover, the processor, used as an implementing element of the above mentioned processor, can perform same or similar functions as the processing units.

The mobile phone further includes the power supply (such as a battery) for supplying power to the components.

In some embodiments of the present disclosure, the power supply can be logically coupled with the processor by using a power management system, thereby implementing functions such as charging, discharging and power consumption management by using the power management system. Although not illustrated in the figure, the mobile phone can further include a Bluetooth module, and the like, which is not further described herein.

In some embodiments of the present disclosure, the mobile phone is merely an example of the terminal 300, and the present disclosure is not limited thereto. The present disclosure can be applied in a mobile phone, a tablet, or other electronic device, which is not limited herein.

Reference throughout this specification to "an embodiment", "some embodiments", "an example", "a specific example" or "some examples" means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics can be combined in any suitable manner in one or more embodiments or examples. In addition, without conflicting, various embodiments or examples or features of various embodiments or examples described in the present specification can be combined by those skilled in the art.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A cover plate assembly for a terminal, comprising:
an annular base comprising an outer circumferential wall and a first inner circumferential wall opposite to the outer circumferential wall, the outer circumferential wall defining a corner-removing portion approaching towards the first inner circumferential wall; and
a cover plate having a mounting hole and a second inner circumferential wall surrounding the mounting hole, the cover plate having a first surface and a second surface opposite to the first surface, the mounting hole running through the first surface and the second surface,
the annular base being embedded in the mounting hole, the outer circumferential wall being opposite to the second inner circumferential wall of the cover plate, and the cover plate assembly defining a gap between the corner-removing portion and the second inner circumferential wall.

2. The cover plate assembly according to claim 1, wherein the outer circumferential wall comprises a first wall surface and a second wall surface obliquely extending from the first wall surface, the gap comprises a first gap between the first wall surface and the second inner circumferential wall and a second gap between the second wall surface and the second inner circumferential wall, and a width of the second gap between the second wall surface and the second inner circumferential wall is greater than a width of the first gap between the first wall surface and the second inner circumferential wall.

3. The cover plate assembly according to claim 2, wherein the annular base further comprises a bottom wall coupled to the second wall surface, the width of the second gap between the second wall surface and the second inner circumferential wall gradually increases in an extending direction of the second wall surface from the first wall surface to the bottom wall.

4. The cover plate assembly according to claim 1, wherein a plurality of coupling lugs extends from the annular base, each coupling lug protrudes outwards in a radial direction of the annular base, and each coupling lug defines another corner-removing portion between an end surface of a free end of the coupling lug and a side wall of the coupling lug.

5. The cover plate assembly according to claim 4, wherein the coupling lug is coupled to the second surface of the cover plate, the cover plate assembly comprises a first adhesive layer provided between the coupling lug and the cover plate, and a second adhesive layer provided between the outer circumferential wall of the annular base and the cover plate.

6. The cover plate assembly according to claim 5, wherein at least one of the first adhesive layer and the second adhesive layer is a UV curing adhesive layer or a thermal curing adhesive layer.

7. The cover plate assembly according to claim 1, wherein the outer circumferential wall of the annular base comprises a plurality of structural surfaces, two adjacent structural surfaces are in smooth transition with each other, and each structural surface is configured as a flat surface or a curved surface.

8. The cover plate assembly according to claim 7, wherein the plurality of structural surfaces is arranged in a circumferential direction of the annular base.

9. The cover plate assembly according to claim 1, wherein the annular base is provided with a support part, and the support part extends from the annular base and protrudes inwards in a radial direction of the annular base.

10. The cover plate assembly according to claim 9, wherein one support part is provided and the one support part is annular; or
a plurality of support parts is provided, and the plurality of support parts is arranged in a circumferential direction of the annular base and spaced apart from one another.

11. A terminal, comprising:
a bracket comprising an outer circumferential wall and a first inner circumferential wall opposite to each other, the bracket further comprising a bottom wall coupled to the outer circumferential wall, the outer circumferential wall defining a corner-removing portion approaching towards the first inner circumferential wall;
a fingerprint identification assembly received in the bracket;
a cover plate having a mounting hole and a second inner circumferential wall surrounding the mounting hole, the mounting hole running through the cover plate in a thickness direction of the cover plate; and
a display unit embedded in the cover plate,
wherein the bracket is embedded in the mounting hole, the outer circumferential wall of the bracket is opposite to the second inner circumferential wall of the cover plate, and the terminal defines a gap between the corner-removing portion and the second inner circumferential wall.

12. The terminal according claim 11, wherein the outer circumferential wall of the bracket comprises a first wall surface and a second wall surface obliquely extending from the first wall surface, the second wall surface is coupled to the bottom wall, and the corner-removing portion is constituted by the first wall surface and the second wall surface.

* * * * *